United States Patent
Satoh et al.

[11] Patent Number: 5,970,310
[45] Date of Patent: Oct. 19, 1999

[54] METHOD FOR MANUFACTURING MULTILAYER WIRING BOARD AND WIRING PATTERN FORMING APPARATUS

[75] Inventors: Shigemasa Satoh; Kenichi Sugeno, both of Hadano; Haruhiko Matsuyama, Hiratsuka, all of Japan

[73] Assignee: Hitachi, Ltd., Tokyo, Japan

[21] Appl. No.: 08/870,404

[22] Filed: Jun. 6, 1997

[30] Foreign Application Priority Data

Jun. 12, 1996 [JP] Japan ..................................... 8-151246

[51] Int. Cl.⁶ .................................................... H01L 21/00
[52] U.S. Cl. ................................ 438/6; 438/128; 438/129
[58] Field of Search ............................ 438/14, 15, 598, 438/599, 6, 128, 129

[56] References Cited

U.S. PATENT DOCUMENTS

| | | | |
|---|---|---|---|
| 4,309,811 | 1/1982 | Calhoun | 438/129 |
| 4,816,422 | 3/1989 | Yerman et al. | 438/6 |
| 4,843,563 | 6/1989 | Takahashi et al. | |
| 4,970,587 | 11/1990 | Abe | |
| 5,102,361 | 4/1992 | Katayama et al. | 438/6 |
| 5,252,508 | 10/1993 | Masuda | 438/128 |
| 5,298,433 | 3/1994 | Furuyama | 438/128 |
| 5,403,684 | 4/1995 | Schroeder et al. | |

FOREIGN PATENT DOCUMENTS

| | | |
|---|---|---|
| 200 814 | 11/1986 | European Pat. Off. |
| 613 051 | 8/1994 | European Pat. Off. |
| 35 06 279 | 8/1986 | Germany |
| 2 271 430 | 4/1994 | United Kingdom |

OTHER PUBLICATIONS

Thin Film Handbook, Ohm Publishing Firm, May 30, 1988, pp. 9–10.

*Primary Examiner*—Kevin M. Picardat
*Attorney, Agent, or Firm*—Fay, Sharpe, Beall, Fagan, Minnich & McKee

[57] ABSTRACT

To form in a batch manner a thin-film wiring pattern in high precision over an entire region of a ceramics multilayer wiring board containing distortion and deformation, a correction amount of the ceramics multilayer wiring board (rotation angle and movement amount of position of this ceramics multilayer wiring board) is calculated in a computer by applying, for instance, the least squares method to positional coordinate values of each of the LSI mounting areas of the ceramics multilayer board and also to positional coordinate values corresponding thereto on a photomask. A support apparatus for supporting the multilayer wiring board is controlled based upon the calculated correction amount, so that the multilayer wiring board can be aligned with respect to the photomask.

15 Claims, 5 Drawing Sheets

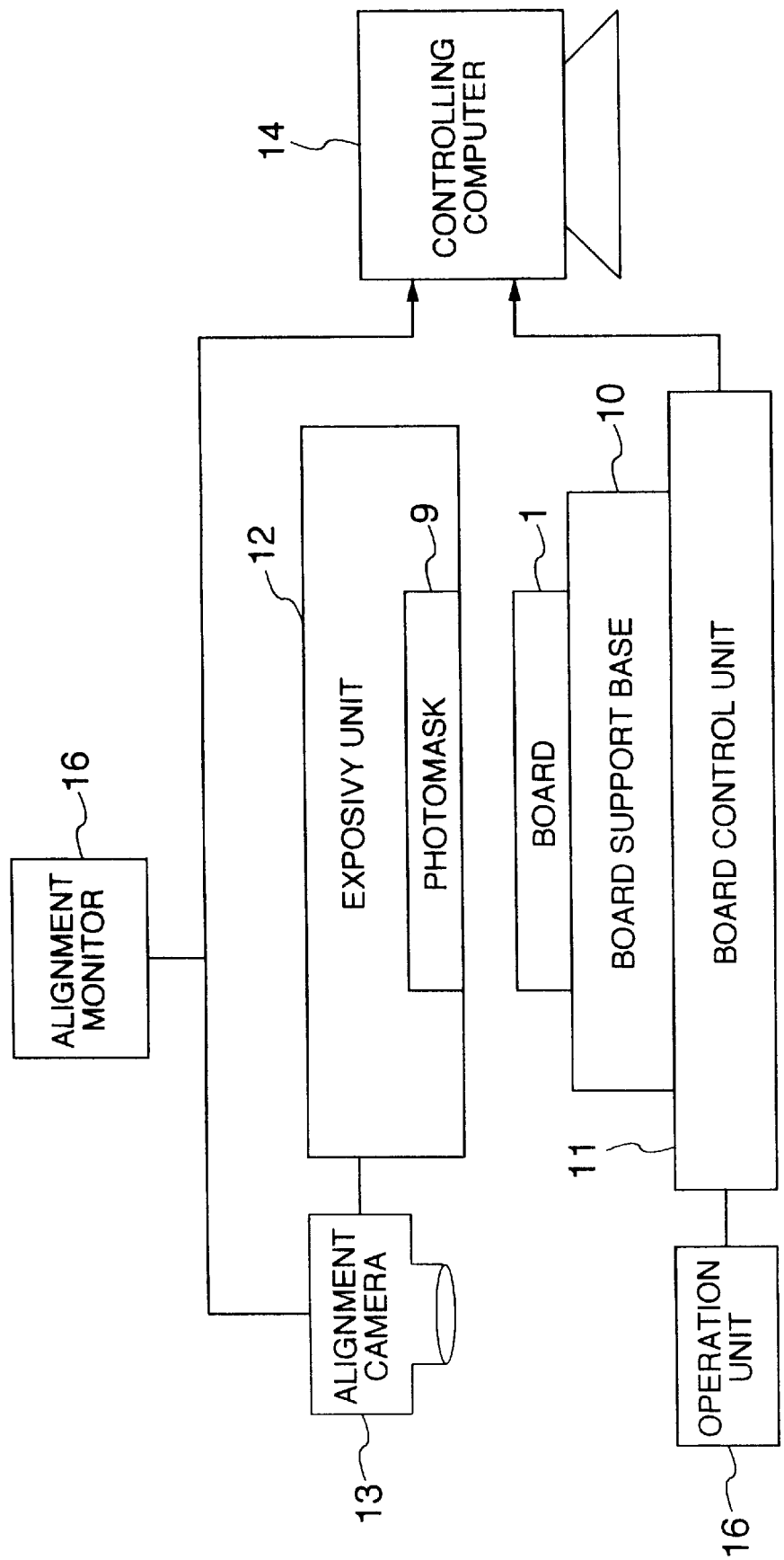

FIG. 4

| STEP NAME | FEATURES OF PRESENT INVENTION | SECTIONAL VIEW OF BOARD |
|---|---|---|
| PRE-PROCESSING STEP | | |
| SINTER CERAMICS BOARD | | ⎯1 |
| MEASURE POSITIONAL COORDINATE VALUES OF SURFACE PATTERN TARGET MARK | CALCULATIONS BY LEAST SQUARES METHOD AND PANALLEL DISPLACEMENT METHOD | |
| DETERMINE POSITIONING CORDINATE VALUES | | |
| COAT ORGANIC INSULATING FILM AND PHOTORESIST | | 8, 7, 1 |
| ALIGMENT/ EXPOSURE | | LIGHT ↓↓↓↓↓↓↓↓↓↓↓ 8, 7, 1 |
| DEVELOPE PHOTORESIST/ ETCHING ORGANIC INSULATING FILM | | 8, 7, 1 |
| STRIP PHOTORESIST/ THERMAL-SETTING OF ORGANIC INSULATING FILM | | 7, 1 |

METHOD FOR MANUFACTURING MULTILAYER WIRING BOARD AND WIRING PATTERN FORMING APPARATUS

BACKGROUND OF THE INVENTION

The present invention generally relates to a method for manufacturing a multilayer wiring board, and a wiring pattern forming apparatus. More specifically, the present invention is directed to such a method for manufacturing a multilayer wiring board and a wiring pattern forming apparatus such that when a large number of LSI mounting areas are provided on a ceramics multilayer wiring board, desirable thin-film wiring patterns are formed by being exposed in a batch mode.

As one of the current attractive LSI mounting (packing) techniques, multilayer wiring boards are utilized on which a large number of LSIs are mounted. In particular, ceramics materials with a supreme thermal (heat) conductivity are employed as board materials, and ceramics multilayer wiring boards constituted by stacking several tens of circuit wiring layers are used (e.g., see Japanese magazine "THIN-FILM HANDBOOK" issued by Ohm publishing firm on May 30, 1988).

Now, a description will be made of a method for manufacturing a ceramics multilayer wiring board.

Either oxide such as alumina powder, murite powder, and glass powder, or a mixture of carbide powder and nitride powder is mixed with an organic polymer material together with a solving agent and plasticizer to thereby form slurry.

Subsequently, after the slurry is defoamed and the viscosity coefficient thereof is adjusted under reduced pressure, the resultant slurry is processed by a sheet forming apparatus so as to have a predetermined thickness and a predetermined width, and the solving agent is vaporized by way of a drying process, so that a flexible ceramics green sheet is formed.

A through hole is formed in the formed ceramics green sheet by using a punch, or laser. Thick-film paste made of metal powder and a viscosity fluid is printed on this through hole and a surface of the ceramics green sheet by employing a printing screen having a desirable opening. A conductive material is filled into the through hole, and a circuit pattern of a conductive film is formed on the surface of the ceramics green sheet.

Several tens of sheets are stacked in accordance with the patterns of the circuit layers to be stacked.

Pressure is applied to the above-described sheet-stacked layer, and then this sheet-stacked layer is heated at temperatures from 100° C. to 200° C., so that the sheets are adhered to each other by utilizing thermoplasticity of the organic polymer material contained in the sheets, and thus a sheet crimp member is manufactured.

Thereafter, the sheet crimp member is further heated at high temperatures from 900° C. to 1,700° C. so as to vaporize the organic polymer materials for constituting the sheet material and the film pattern material, and also the solving agent. Also, the ceramics powder for constituting the sheet material, and the metal powder for constituting the film pattern are sintered to thereby constitute the ceramics multilayer wiring board.

Then, after a desirable thin-film outer wiring pattern has been formed on the surface of this ceramics multilayer wiring board, a large number of LSI chips are arranged on this board and is mounted in high density. These LSI chips are mutually connected by the multilayer wiring patterns formed inside the board, and the outer wiring patterns formed on the surface of the board.

When a thin-film wiring pattern is formed, after photoresist is coated on the multilayer wiring board, the photoresist-coated multilayer wiring board is exposed in a photomask pattern shape by utilizing a photomask having a predetermined opening portion, and then the photoresist of the exposed portion is removed to thereby form an organic insulating film. Under such a circumstance, to form the external wiring pattern in higher precision, the photomask must be correctly aligned with respect to the multilayer wiring board. In general, when this sort of alignment is carried out, through holes formed in two corners, or four corners of an outer edge of a board are used as target marks, and these target marks are aligned with target marks of a photomask.

In the ceramics sintering step, unwanted distortion or unwanted deformation will occur in the fabricated multilayer wiring board. As a consequence, in accordance with the conventional alignment method, although positional shifts of the patterns located near the alignment through holes for the board are small, positional shifts of the patterns located apart from the through holes are large. It is practically difficult to eliminate the large positional shifts.

On the other hand, this sort of problem may be avoided by employing the split exposure method, and the step exposure method. In this split exposure method, the board is split into a plurality of regions, the alignment process operations are carried out with respect to each of these split regions, and then the photomask patterns are exposed. In the step exposure method, the photomask patterns are successively exposed in a predetermined pitch. However, these conventional exposure methods own such problems that since the manufacturing steps are considerably increased, higher cost is necessarily required.

SUMMARY OF THE INVENTION

The present invention has been made to solve the problems of the prior art, and therefore, has an object to provide a multilayer wiring board manufacturing method and a thin-film wiring pattern forming apparatus capable of executing exposing/developing process operations in a step for forming a thin-film wiring pattern in a batch manner in high precision with respect to a large number of LSI mounting areas over an entire region of a ceramics multilayer wiring board even when such a ceramics multilayer wiring board containing distortion and/or deformation is employed.

The above-described object of the present invention can be effectively achieved by utilizing a large number of LSI mounting areas provided on the ceramics multilayer wiring board as an alignment target mark.

A large quantity of LSI mounting areas are formed over the substantially entire surface of the multilayer wiring board, and positional coordinate values of the respective LSI mounting areas can be calculated by executing a predetermined calculation process operation for image data which has been acquired by employing, for instance, a television camera. In accordance with the present invention, a preselected calculation process operation (e.g., calculation process operation by least squares method) is carried out for the calculated positional coordinate values of the LSI mounting areas, and also positional coordinate values (reference positional coordinate values) on a photomask corresponding to each of the LSI mounting areas, so that a correction amount (rotation angle, and movement amount of position) of the multilayer wiring board required for the alignment is calculated. Then, the position of the multilayer wiring board is controlled based on the calculated correction amount in order to align the board with respect to the photomask.

According to the present invention, since the entire region of the ceramics multilayer wiring board containing the distortion or the deformation can be aligned with the photomask within one time in high precision, the thin-film pattern with high precision can be fabricated on a large-sized board by carrying out the exposing operation within one time.

Also, according to the present invention, after a support apparatus for supporting the multilayer wiring board is controlled based on the calculated correction amount so as to align this board with respect to the photomask, the exposing operation is performed by an exposing unit so as to form the thin-film wiring pattern on the surface of the board. As a consequence, it is possible to form the thin-film wiring pattern in high precision with respect to a large number of LSI mounting areas over the entire region of this board.

BRIEF DESCRIPTION OF THE DRAWINGS

For a better understanding of the present invention, reference is made of a detailed description to be read in conjunction with the accompanying drawings, in which:

FIG. 3 schematically shows an overall arrangement diagram of an apparatus with employment of a alignment method according to an embodiment of the present invention;

FIG. 4 is an illustration for indicating a process flow operation for forming a thin film by using the alignment method of the present invention;

DESCRIPTION OF THE PREFERRED EMBODIMENTS

Various embodiment modes of a method for manufacturing a multilayer wiring board, and of a wiring pattern forming apparatus in accordance with the present invention will now be described in detail with reference to drawings.

Figure 1:
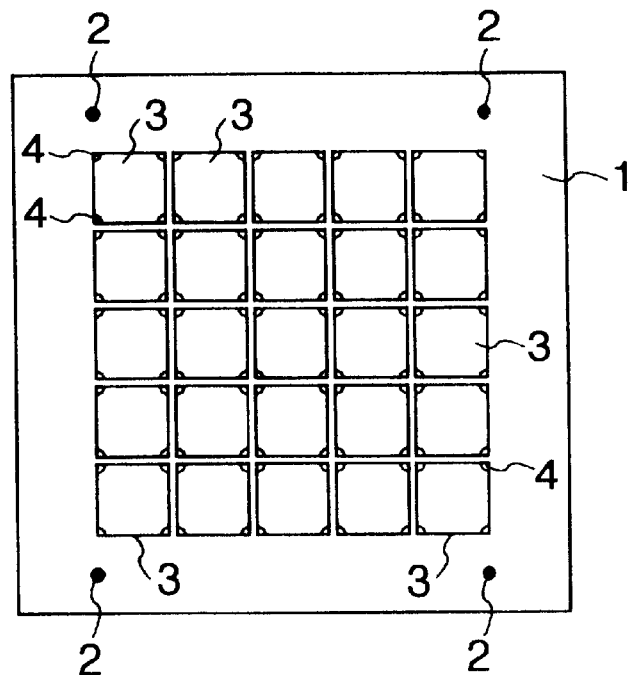
FIG. 1 is a conceptional drawing for indicating a structural example of a typical ceramics multilayer wiring board.

FIG. 1 is a conceptional drawing for schematically indicating a structural example of one typical ceramics multilayer wiring board. In FIG. 1, reference numeral 1 shows a multilayer wiring board, reference numeral 2 denotes a alignment through hole used when a position of a photomask is made coincident with a position of the multilayer wiring board, and reference numeral 3 represents a large number of LSI mounting (packing) areas provided on one side of the board 1, on which a thin film is formed. Also, reference numeral 4 denotes LSI-connecting terminal pads formed at four corners of the respective LSI mounting areas. Alignment of the through holes 2 is determined in accordance with an exposing unit under use as same as in the prior art. Normally, these through holes 2 are arranged in peripheral portions which are mutually symmetrical along the upper/lower/right/left directions with respect to a center of the multilayer wiring board 1.

Figure 2:
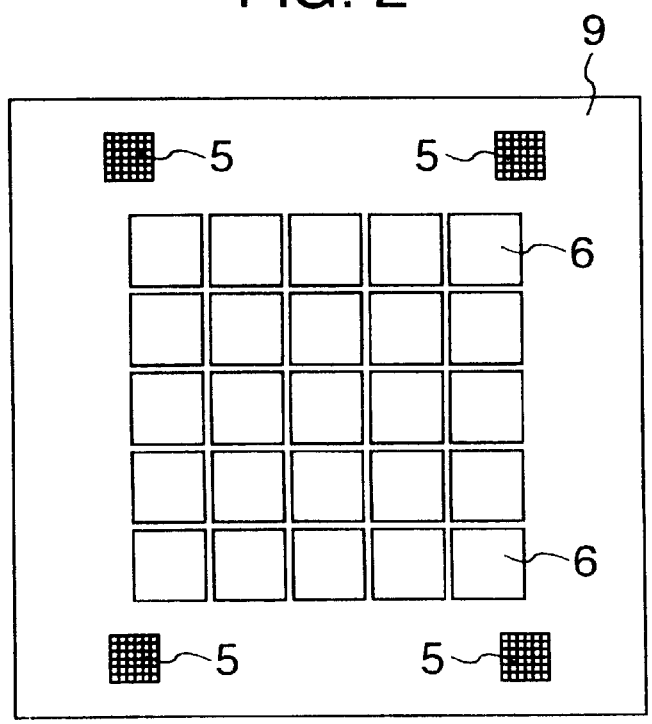
FIG. 2 is a conceptional drawing for representing a structural example of a typical photomask.

FIG. 2 is a conceptional diagram for representing a structural example of one typical photomask. In FIG. 2, reference numeral 9 is a photomask, reference numeral 5 shows a plurality of coordinate grid patterns constituted by grids with a constant interval, and reference numeral 6 indicates a large number of mask patters. Each of these coordinate grid patterns 5 is formed in such a manner that a center of this coordinate grid pattern is made coincident with a center of the alignment through hole 2 corresponding thereto. Also, each of these mask patterns 6 is a pattern used to form a thin film on the LSI mounting area 3 corresponding thereto.

Referring now to FIG. 3, a description will be made of an overall arrangement of an apparatus in which the board 1 is aligned (positioned) with the photomask 9 to thereby form a thin-film-shaped wiring pattern. In FIG. 3, reference numeral 13 shows a alignment camera, reference numeral 12 represents an exposing unit, reference numeral 10 indicates a board support base, and reference numeral 11 denotes a board control unit. Also, reference numeral 14 is a controlling computer, reference numeral 15 shows a monitor for displaying a picture (image) transmitted from the alignment camera, and reference numeral 16 represents an operation unit used to input movement amount information to the board control unit.

First, the LSI mounting areas 3 and the mask alignment through holes 2 on the board 1 are recognized by a board surface reading apparatus (not shown in the drawing), and then the recognized image data is sent to the controlling computer 14.

As the image data, the image date about such a representation that the positions of the LSI connecting terminal pads 4 formed on the board 1, and also other portions on which the LSIs are not mounted are displayed in different colors are transferred to the controlling computer 14. The image data sent to the controlling computer 14 are processed by way of a predetermined calculating process operation so as to calculate the positional coordinate values of the LSI connecting terminal pads 4 in the LSI mounting areas 3, and also the positional coordinate values of the mask alignment through hole 2. Then, the controlling computer 14 calculates a positional relationship between the board 1 and the photomask 9 based upon the above-calculated respective positional coordinate values $(x_i, y_i)$, another positional coordinate value of a coordinate grid pattern on the photomask 9, namely a reference positional coordinate value $(X_i, Y_i)$, and a further positional coordinate value corresponding to an opening portion for printing the LSI connecting terminal pad in such a manner that a positional shift between the board 1 and the photomask 9 can be reduced. It should be noted that both the positional coordinate values of the LSI connecting terminal pads 4 on the LSI mounting areas 3 and the positional coordinate values of the mask alignment through holes 2 are combined with each other to be indicated as the positional coordinate values $(x_i, y_i)$, whereas both the positional coordinate values of the coordinate grid pattern on the photomask 9 and the positional coordinate values corresponding to the opening portion for printing the LSI connecting terminal pad are combined with each other to be indicated as the reference positional coordinate values $(X_i, Y_i)$, and also a total number of the coordinate values is "n".

Now, the calculation method thereof will be described.

Assuming now that positional coordinate values on the board 1 are set as $(x'_i, y'_i)$ in such a case that the board 1 is rotated by an angle of "θ", and then is moved by (a, b) in a parallel manner, a difference between the component of the reference positional coordinate values $(X_i, Y_i)$ of the photomask 9 and $x'_i$ component of this positional coordinate values $(x'_i, y'_i)$ is squared, and also another difference between the y component of the reference positional coordinate values $(X_i, Y_i)$ of the photomask 9 and the $y'_i$ component of this positional coordinate values $(x'_i, y'_i)$ is squared. These squared difference values are summed with each other. Distances between the positional coordinate values on the board 1 and the positional coordinate values of the photomask 9 are squared with respect to each of the coordinate values, respectively. Then, all of the squared distances in the respective coordinate values are summed with each other. Both the angle "θ" and the movement amount (a, b) may be determined in such a manner that this summed distance value becomes minimum.

When it is expressed by the following formula (1), it is given as follows:

$$L=\Sigma\{(X_i-x'_i)^2+(Y_i-y'_i)^2\} \quad (1).$$

Accordingly, the values of "θ", "a", "b" may be determined in such a manner that symbol "L" becomes minimum.

Each of positional coordinate values $(x'_i, y'_i)$ on the board 1 in such a case that the board 1 is rotated and moved in the parallel manner may be calculated in accordance with the following calculation formulae by employing the rotation angle "θ", the movement amount (a, b), and the positional coordinate values $(x_i, y_i)$ before movement;

$$x'_i = x_i \cos+y_i \sin+a \quad (2),$$

$$y'_i = -x_i \sin+y_i \cos+b \quad (3).$$

The above-explained formula (2) and formula (3) are substituted for the above-described formula (1), and solutions of the below-mentioned equations (4), (5), (6) are obtained as values of "θ", "a", "b" in such a manner that "L" is minimized. In these equations (4), (5), (6), "L" is partial-derivative-calculated to become 0.

$$\partial L/\partial \theta = 0 \quad (4)$$

$$\partial L/\partial a = 0 \quad (5)$$

$$\partial L/\partial b = 0 \quad (6)$$

Since the above-described equations are solved, these values "θ", "a", "b" may be obtained as follows:

$$\tan \theta = \{(\Sigma X_i \Sigma y_i - \Sigma x_i \Sigma Y_i)/n + \Sigma(x_i Y_i - X_i y_i)\} + \{(\Sigma x_i \Sigma X_i + \Sigma y_i \Sigma Y_i)/n - \Sigma(x_i X_i + y_i Y_i)\} \quad (7)$$

$$a = (\cos \theta \Sigma x_i - \sin \theta \Sigma y_i - \Sigma X_i)/n \quad (8)$$

$$b = -(\cos \theta \Sigma y_i + \sin \theta \Sigma x_i + \Sigma Y_i)/n \quad (9)$$

The controlling computer 1 executes the above-described calculations to obtain the calculation results, and then supplies the movement amount information produced based on the calculation results to the board control unit 11. Then, the board control unit 11 causes the board 1 supported on the board support base 10 to be transported by the rotation angle "θ" and the movement amount (a, b).

When positional shifts between the respective positional coordinate values $(x'_i, y'_i)$ on the moved board 1 and the reference positional coordinate values $(X_i, Y_i)$ of the photomask 9 are expressed as a distribution diagram, this distribution diagram is indicated in, for example, FIG. 5.

Figure 5A:
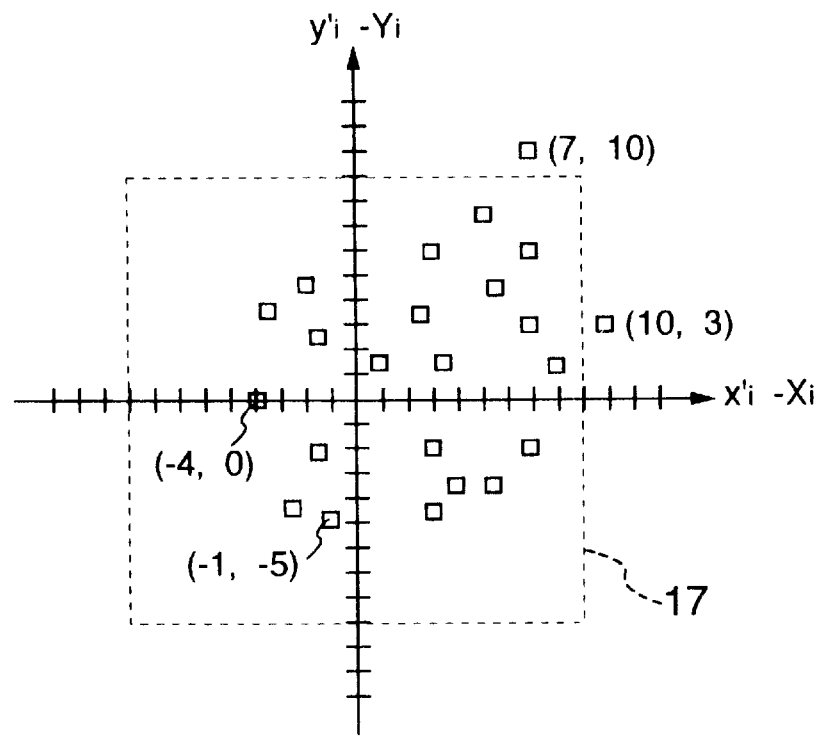
FIGS. 5A and 5B are diagrams for graphically showing a distribution positional shifts in a coordinate system.
Figure 5B:
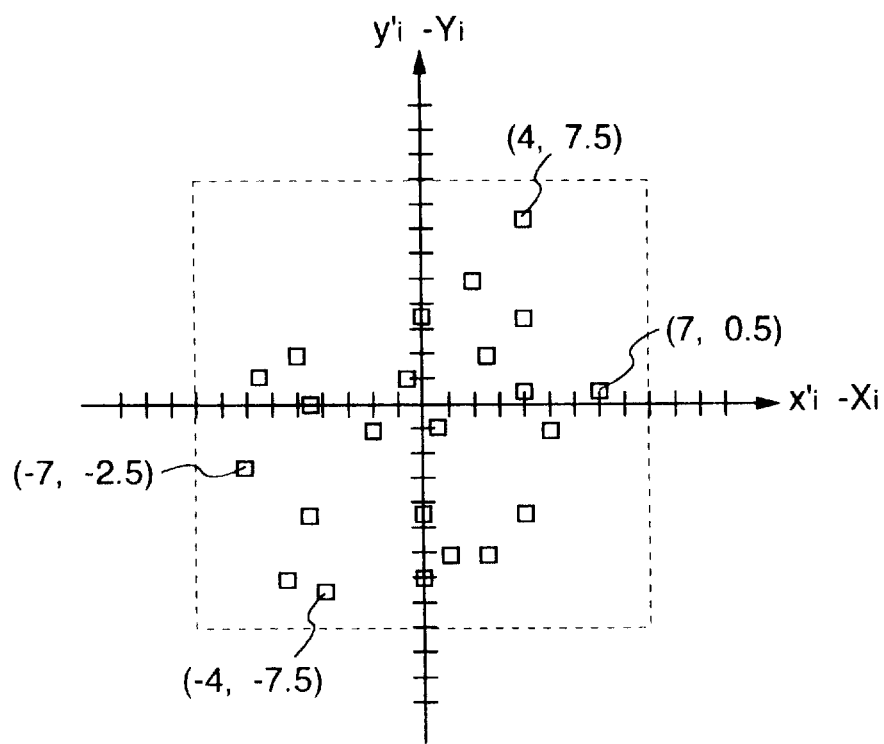

In FIGS. 5A and 5B are origin of the coordinate axes indicates the reference positional coordinate values of the photomask 9. The x axis and the y axis represent shift amounts of the coordinate and directions of the shift amounts. Concretely speaking, the plotted coordinate values are $(x'_i-X_i, y'_i-Y_i)$.

As apparent from FIG. 5A, the positional coordinate values of the moved board 1 do not always express a uniform distribution from the positional coordinate values of the photomask 9. At the most largely shifted position, the positional coordinate values exceed an allowable range 17 functioning as a mounting position indicated by a dot line. The actual mounting condition under this positional shift state is shown in FIGS. 6A, 6B and 6C.

Figure 6A:
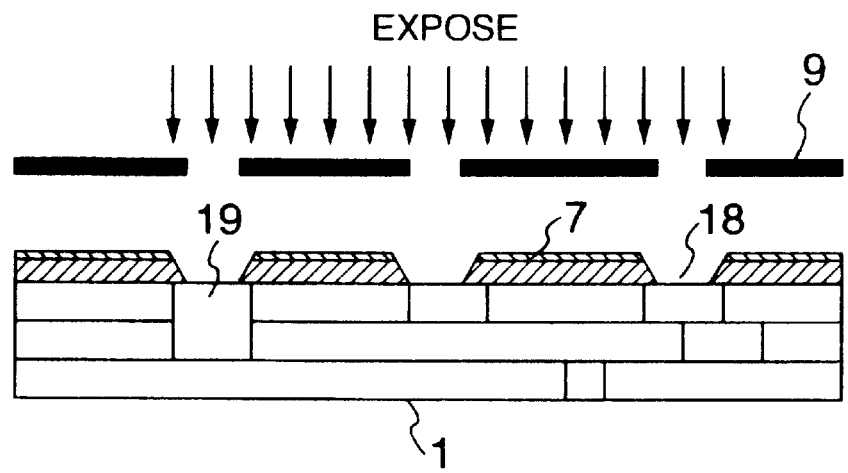
FIGS. 6A, 6B and 6C are diagrams for graphically indicating positional shifts in printing works on the wiring board.
Figure 6B:
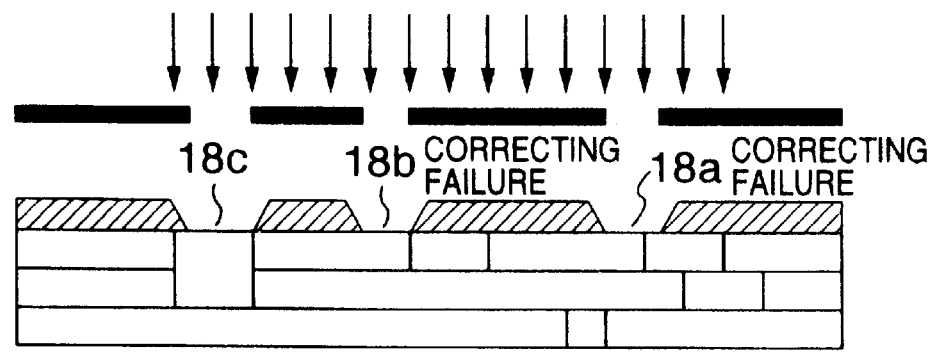
Figure 6C:
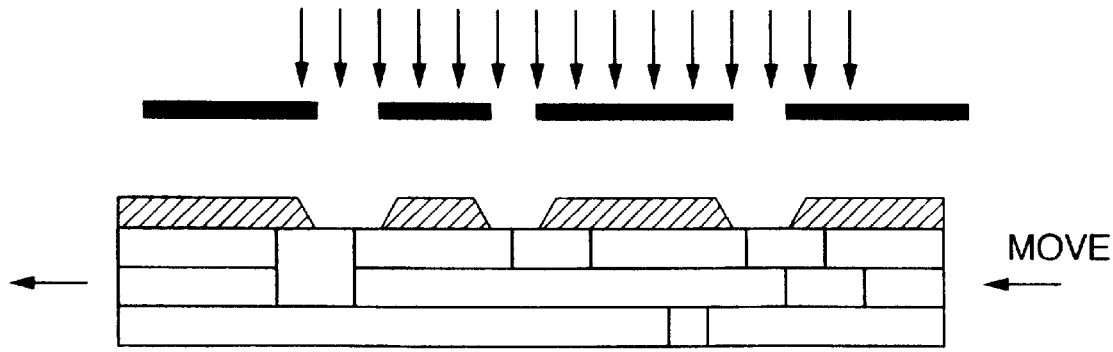

In FIGS. 6A, 6B and 6C, reference numeral 7 indicates an organic insulating film, reference numeral 18 shows an opening portion of the organic insulating film on which a conductor is printed, and reference numeral 19 denotes a conductor portion (connecting land) formed in a ceramics multilayer wiring board. Reference numeral 1 shows a ceramics multilayer wiring board, and reference numeral 9 shows a photomask.

In the case that the board is originally mounted under normal condition, as shown in FIG. 6A, the opening portion 18 on which the conductor layer should be printed must be printed in such a manner that this opening portion 18 is completely involved on the connecting land 19. If the positional coordinate values of the photomask 9 are largely shifted from the positional coordinate value on the board due to compression and the like, as illustrated in FIG. 6B, then such opening portions 18a and 18b are formed, resulting in connecting failures. As to the opening portion 18a, only a very small portion of the connecting land 19 is overlapped with the conductor layer printing opening portion 18. As to the opening portion 18b, the connecting land 19 is not completely overlapped with the conductor layer printing opening portion 18.

Therefore, to solve the above-described problem, as illustrated in FIG. 6C, the entire board is slightly and further moved within such a range that the opening portion 18c located in the allowable range is not shifted from the allowable range. As a result, it is required to control the board in such a manner that the opening portions outside the allowable range can be stored within the allowable range.

Now, a sequential control operation used to solve the above-described problems will be described.

Assuming now that a difference in x components of positional coordinate values $(x'_j, y'_j)$ having the largest value of the values $(x'_i-X_i)$ corresponding to the positional shifts along the x direction between the positional coordinate values $(x'_i, y'_i)$ of each of the LSI mounting areas after the board is moved, and the reference positional coordinate values $(X_i, Y_i)$ of the photomask 9 is set as $\max(x'_j-X_j)$; a difference in x components of positional coordinate values $(x'_k, y'_k)$ in which the positional shift along the x direction is the smallest one is set as $\min(x'_k, X_k)$; a difference in y components of positional coordinate values $(x'_l, y'_l)$ in which a value of $(y'_l-Y_l)$ corresponding to the positional shift along the y direction becomes the largest value is set as $\max(y'_l-Y_l)$; and also a difference in y components of positional coordinate values $(x'_m, Y'_m)$ in which the positional shift along the y direction becomes the smallest value is set as $\min(y'_m-Y_m)$, such positional coordinate values $(x''_l, y''_l)$ that the maximum positional shift of the positional coordinate values of the photomask corresponding to each of the LSI mounting areas becomes a minimum positional shift are defined based upon the following formulae (10) and (11):

$$x''_i = x'_i - (\max(x'_j-X_k) + \min(x'_k-X_k))/2 \quad (10),$$

and $$y''_i = y'_i - (\max(y'_l-Y_l) + \min(y'_m-Y_m))/2 \quad (11).$$

Then, in accordance with the above-described positional relationship between the board 1 and the photomask 9 obtained in the formula (2), the controlling computer 14 performs simulation. The controlling computer 14 simulates how the alignment through hole 2 is observed through the alignment coordinate grid pattern 5 on the photomask 9 in the case that the positional coordinate values $(x'_i, y'_i)$ of each of the LSI mounting areas are furthermore moved to $(x''_i, y''_i)$ in a parallel manner. The simulated result is displayed on the alignment monitor 16.

Referring now to FIG. 5, the above-explained parallel movement will be described more in detail.

FIG. 5A represents a distribution diagram for showing positional shifts between the positional coordinate values $(X_i, Y_i)$ of the photomask, and the respective positional coordinate values $(x'_i, y'_i)$ after the board has been moved by the correction amounts defined in the above-explained formulae (7), (8), (9), namely after the first movement.

In FIG. 5A, since the component differences $\max(x'_j - X_j)$ is 10, $\min(x'_k - X_k)$ is $-4$, $\max(y'_l - Y_l)$ is 10, and $\min(y'_m - Y_m)$ is $-5$, the formulae (10) and (11) may be defined as follows:

$$X''_i = x'_i - (10 + (-4))/2 \quad (12)$$
$$= x'_i - 3,$$

$$y''_i = y'_i - (10 + (-5))/2 \quad (13)$$
$$= y'_i - 2.5.$$

Based upon the above-described formulae, the entire board is moved by $-3$ along the x-axis direction and by $-2.5$ along the y-axis direction. In FIG. 5B, there is shown a distribution diagram for representing positional shifts in the coordinate values after the board has been moved, namely second movement. Since the points located outside the allowable range in FIG. 5A are stored within the allowable range, occurrences of defects can be avoided as the entire board.

Thereafter, the board is exposed by the exposing unit 12 (will be discussed later).

Next, a series of process operations for forming a thin-film shaped wiring pattern will now be explained with reference to FIG. 3 and FIG. 4.

Ceramic powder is mixed with an organic binder to fabricate a sheet called as "a green sheet". Through holes are made in this green sheet by using a punch and the like. Then, after conductive paste is filled into this through hole, a pattern is printed out on the sheet by similarly using the conductive paste. Furthermore, a plurality of such sheets are overlapped with each other, and the overlapped sheets are sintered by a sintering furnace at higher temperatures than 1,000 degrees, so that the ceramics multilayer wiring board 1 is formed.

Next, the process operation is entered to the thin film forming stages. The board 1 is set on the board support base 10, and the controlling computer 14 will acquire a positional relationship between the board 1 and the photomask 9 (correction amount) by way of the above-explained calculating method in such a manner that the positional shift between the board 1 and the photomask 9 can be reduced. Then, the organic insulating film 7 and a photoresist 8 are successively coated on the board 1. Subsequently, the photomask 9 is set to the exposing unit 12.

Now, a description will be made of the coordinate grid pattern used in the alignment operation.

The coordinate grid pattern 5 is fabricated on the mask by performing a method similar to the opening pattern forming method for the photomask.

Concretely speaking, when the photomask is formed, the resist films are formed not only on a shielded portion corresponding to portions other than the opening portion of the mask, but also on a grid pattern shape which will constitute the coordinate grid pattern, so that the coordinate grid pattern is not etched away but is left during the etching process. As a result, such a coordinate grid is formed that the portion other than the coordinate grid pattern portion constitutes the opening portion. In this embodiment, a diameter of the alignment through hole is 60 $\mu$m, a line width of the grid line is 4 $\mu$m, and a grid pitch is 20 $\mu$m. That is, a grid pattern having an opening of 16 $\mu$m ×16 $\mu$m was fabricated. When the grid is observed through the alignment camera 13, since eyes of a human operator can analyze ¼ of the grid pitch, the photomask 9 can be positioned on the board 1 in the precision of 5 $\mu$m.

The alignment method for the board and the photomask is carried out as follows: The controlling computer 14 simulates how the positional coordinate system of the mask alignment through hole 2 is observed through the coordinate grid pattern 5 formed on the mask when the board is moved only by the correction amount calculated by the above-described calculation, and displays the simulation result on the alignment monitor 15. Next, the mask alignment through hole 2 is actually observed via the coordinate grid pattern by using the alignment camera 13. While comparing the above-described simulation result with this actually observed through hole 2, the board 1 is moved in the parallel manner in order that the through hole 2 can be arranged on the desirable position on the coordinate grid pattern. The movement of the board 1 is carried out by inputting the movement information by manipulating the operation unit 16 corresponding to the input means such as a joy stick and a keyboard connected to the board control unit 11.

Thereafter, the board is exposed via the mask pattern by the exposing unit 12. As shown in FIG. 4, the photoresist 8 is developed with respect to the latent image formed by this exposing operation, and subsequently, the organic insulating film 7 is etched away, so that the organic insulating film 7 having a desirable opening pattern is derived. The pattern of the organic insulating film 7 formed in the above-described manufacturing stage is hardened after the photoresist 8 has been stripped and this organic insulating film is thermally treated by 300 to 400° C. As a result, the formation of the first thin film layer is accomplished. The second thin film layer and the subsequent thin film layers are formed by aligning the board with respect to the photomask in a similar manner, so that the multilayer ceramics board may be manufactured.

As to the above-explained board movement, there is an alternative method. That is, the controlling computer 14 may issue a movement instruction to the board control unit 11 in accordance with the positional relationship between the board 1 and the photomask 9 calculated by the calculations, so that the board control unit 11 may further move the positional coordinate values $(x'_i, y'_i)$ of each of the LSI mounting areas to another coordinate position $(x''_i, y''_i)$ in the parallel mode.

As apparent from the foregoing detailed descriptions, in accordance with the multilayer wiring board manufacturing method and the wiring pattern forming apparatus of the present invention, the overall ceramics multilayer wiring board involving distortion and deformation can be aligned with respect to the photomask in high precision within one time. As a consequence, the thin film pattern with high precision can be formed on the large-sized board by performing the exposing process only one time.

What is claimed is:

1. A method for manufacturing a multilayer wiring board by forming an insulating film and a wiring pattern on a wiring board, wherein:

image data acquired by imaging a large number of LSI mounting areas provided on the wiring board is processed by a predetermined calculation process to thereby calculate positional coordinate values of said LSI mounting areas;

positional coordinate values of a alignment through hole formed on the wiring board, said calculated positional coordinate values of the LSI mounting areas, positional coordinate values on a photomask, corresponding to each of said LSI mounting areas and functioning as reference positional coordinate values, and also positional coordinate values of a alignment grid formed on said photomask are processed by a predetermined calculation process, whereby a correction amount of said wiring board required for the alignment operation is calculated; and the position of said wiring board is relatively moved with respect to said photomask based on said correction amount, whereby the alignment operation of said wiring board with respect to said photomask is carried out.

2. A multilayer wiring board manufacturing method as claimed in claim 1 wherein:

the calculation of said correction amount of said wiring board includes a calculation of a movement amount of the wiring board, in which after a least squares method calculation is performed for the positional coordinate values of the alignment through hole formed on the wiring board; the calculated positional coordinate values of the LSI mounting areas; the positional coordinate values on the photomask corresponding to each of said LSI mounting areas, functioning as the reference positional coordinates; and the positional coordinate values of the alignment grid formed on this photomask, maximum values in the positional shifts along an x-axis direction and a y-axis direction contained in the positional coordinate values of the alignment through hole, the positional coordinate values of the LSI mounting areas, and said reference positional coordinate values corresponding thereto become minimum values.

3. A multilayer wiring board manufacturing method as claimed in claim 1 wherein:

alignment of said wiring board with respect to said photomask is carried out by such a way that said alignment through hole formed on the wiring board is made coincident with an optimum position with respect to the alignment grid pattern provided on said photomask.

4. A multilayer wiring board manufacturing method as claimed in claim 1 wherein:

the positional coordinate values of said LSI mounting areas are represented as positional coordinate values of a specific component whose image can be discriminated in said LSI mounting area.

5. A multilayer wiring board manufacturing method as claimed in claim 4 wherein:

as said component, a terminal pad for connecting the LSI mounted on said wiring board is employed.

6. A thin-film wiring pattern forming apparatus comprising:

a controlling computer in which a preselected calculation process is performed for image data acquired by imaging a large number of LSI mounting areas provided on a wiring board so as to calculate positional coordinate values of said LSI mounting areas, and another preselected calculation process is executed for positional coordinate values of alignment through holes formed on the wiring board, said calculated positional coordinate values of said LSI mounting areas, positional coordinate values on a photomask, which corresponds to each of said LSI mounting areas and are equal to reference positional coordinate values, and also positional coordinate values of an alignment grid 5 formed on said photomask, whereby a correction amount of said wiring board required for a alignment operation is calculated;

a board control unit for controlling a board support base for supporting said wiring board based on said correction amount to thereby relatively move the position of said wiring board with respect to said photomask; and an exposing unit for exposing said wiring board through said photomask.

7. A thin-film wiring pattern forming apparatus as claimed in claim 6 wherein:

said controlling computer executes a first calculation process operation by way of a least squares method with respect to the positional coordinate values of the alignment through holes formed on the wiring board, said calculated positional coordinate values of the LSI mounting areas, the positional coordinate values on the photomask, which corresponds to each of said LSI mounting areas and is equal to the reference position coordinate values, and also the positional coordinate values of the alignment grid formed on said photomask; and thereafter executes a second calculation process operation for calculating a movement amount of the wiring board, which minimizes maximum values of positional shifts along an x-axis direction and a y-axis direction among the positional coordinate values of the alignment through holes, the positional coordinate values of the LSI mounting areas, and the reference positional coordinate values corresponding thereto, which have been processed by said first calculation process operation.

8. A thin-film wiring pattern forming apparatus as claimed in claim 7 wherein:

said board control unit controls the board support base for supporting said wiring board based upon the result of said first calculation process operation by said controlling computer to thereby relatively move the position of said wiring board with respect to said photomask; and information about the movement amount produced based upon the result of said second calculation process operation by said controlling computer is inputted to said board control unit by an operation unit for inputting the information about the movement amount, whereby said board support base is controlled and the position of said wiring board is relatively moved with respect to said photomask.

9. A thin-film wiring pattern forming apparatus as claimed in claim 7 wherein:

said board control unit controls the board support base for supporting said wiring base based upon the result of said calculation process operation and also the result of said calculation process operation by said controlling computer, whereby the position of said wiring board is relatively moved with respect to said photomask.

10. A method for forming a thin-film wiring pattern by repeatedly executing plural times a step for forming an insulating film made of an organic insulating material on a multilayer wiring board, and a step for forming a conductor pattern made of a conductive member on said insulating film, wherein:

said step for forming the insulating film includes a step for aligning said multilayer wiring board with respect to a photomask, and a step for performing an exposing operation via said photomask; and said step for aligning said multilayer wiring board with respect to said photomask is performed by making an alignment through hole formed in said multilayer wiring board coincident with an optimum position with respect to an alignment grid pattern formed on said photomask.

11. A thin-film wiring pattern forming method as claimed in claim 10 wherein:

the alignment of said multilayer wiring board with respect to said photomask is carried out by making said alignment through hole having a diameter of 60 μm coincident with the optimum position for said alignment grid pattern having such a grid shape that a line width formed on said photomask is 4 μm, and a pitch of parallel lines is 20 μm.

12. A thin-film wiring pattern forming method as claimed in claim 10 wherein:

said optimum position of said alignment through hole with respect to said alignment grid pattern is obtained by calculating said correction amount of said wiring board required for the alignment operation in such a manner that a preselected calculation process is performed for image data acquired by imaging a large number of LSI mounting areas provided on said multilayer wiring board so as to calculate positional coordinate values of said LSI mounting areas, and another preselected calculation process is executed for positional coordinate values of alignment through holes formed on the multilayer wiring board, said calculated positional coordinate values of said LSI mounting areas, positional coordinate values on a photomask, which corresponds to each of said LSI mounting areas and are equal to reference positional coordinate values, and also positional coordinate values of an alignment grid formed on said photomask.

13. A thin-film wiring pattern forming method as claimed in claim 12 wherein:

the calculation of said correction amount of said multilayer wiring board is carried out in such a manner that after executing a first calculation process operation by way of a least squares method with respect to the positional coordinate values of the alignment through holes formed on the multilayer wiring board, said calculated positional coordinate values of the LSI mounting areas, the positional coordinate values on the photomask, which corresponds to each of said LSI mounting areas and is equal to the reference position coordinate values, and also the positional coordinate values of the alignment grid formed on said photomask; and a second calculation process operation for calculating a movement amount of the multilayer wiring board is executed, which minimizes maximum values of positional shifts along an x-axis direction and a y-axis direction among the positional coordinate values of the alignment through holes, the positional coordinate values of the LSI mounting areas, and the reference positional coordinate values corresponding thereto, which have been processed by said first calculation process operation.

14. A thin-film wiring pattern forming method as claimed in claim 12 wherein:

the positional coordinate values of said LSI mounting areas are represented as positional coordinate values of a specific component whose image is discriminatable within said LSI mounting areas.

15. A thin-film wiring pattern forming method as claimed in claim 14 wherein:

an LSI connecting terminal pad formed on said wiring board is employed as said component.

* * * * *